United States Patent [19]
Tompkins

[11] 3,965,417
[45] June 22, 1976

[54] COHERENT COMPONENT MAGNITUDE DETECTOR

[75] Inventor: Donald R. Tompkins, Laramie, Wyo.

[73] Assignee: The United States of America as represented by the Secretary of the Navy, Washington, D.C.

[22] Filed: June 26, 1975

[21] Appl. No.: 590,667

[52] U.S. Cl. .............................. 324/77 R; 328/139; 325/476; 325/477
[51] Int. Cl.² ........................................ G01R 23/16
[58] Field of Search ............. 324/77 R, 77 A, 77 E, 324/140 R, 140 D; 328/161, 162, 165, 167, 137, 139; 307/229, 230; 325/474–477

[56] References Cited
UNITED STATES PATENTS

| | | | |
|---|---|---|---|
| 2,834,879 | 5/1958 | Bauman | 328/139 |
| 3,858,117 | 12/1974 | Denny | 325/476 |

*Primary Examiner*—R. V. Rolinec
*Assistant Examiner*—Michael J. Tokar
*Attorney, Agent, or Firm*—R. S. Sciascia; R. E. O'Neill

[57] ABSTRACT

The identification of random and coherent components of an unspecified signal wherein at least a pair of band pass filters, each having the same center frequency but different bandwidths, are employed to make the identification.

4 Claims, 6 Drawing Figures

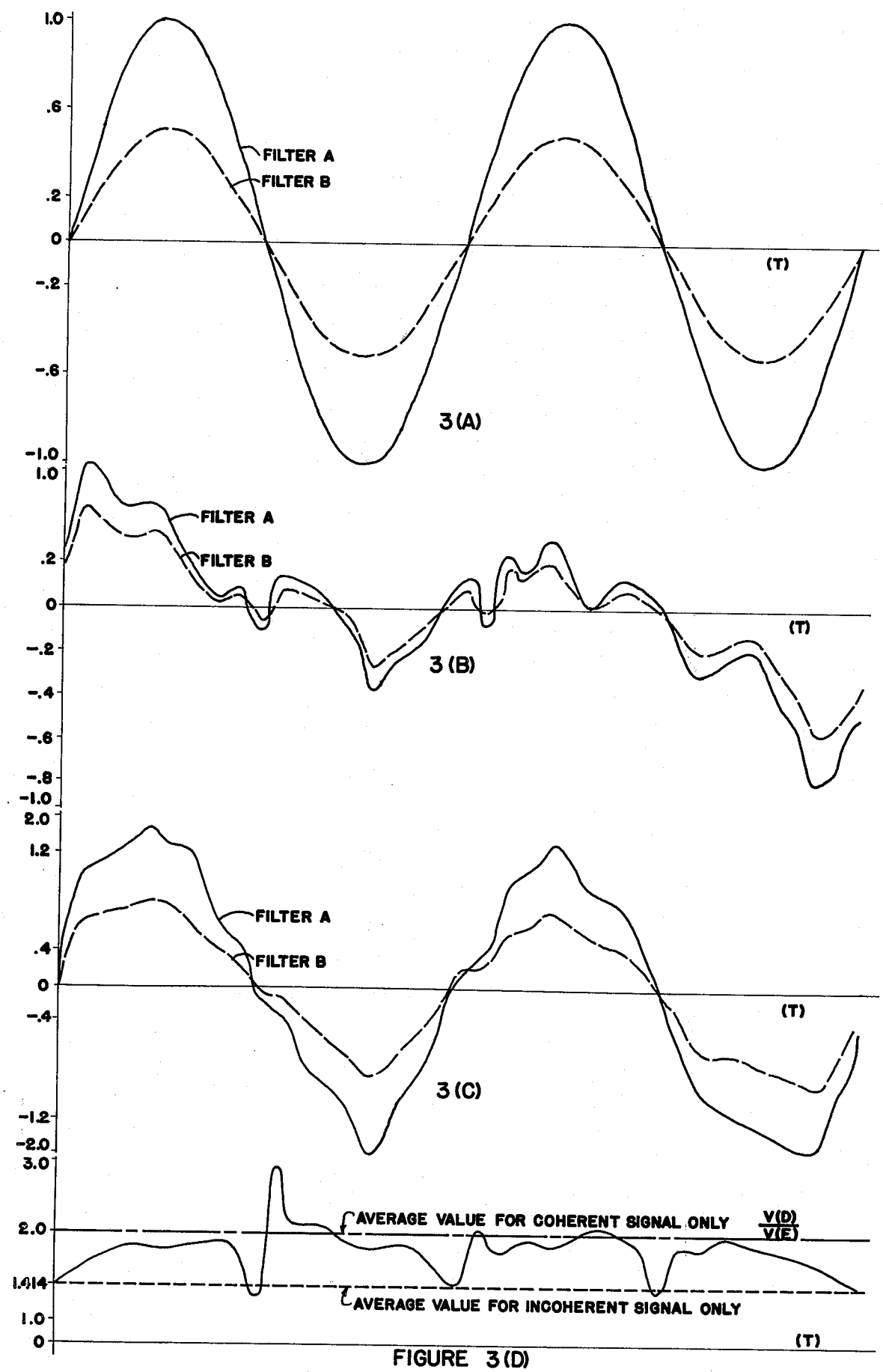

COHERENT COMPONENT MAGNITUDE DETECTOR

The invention described herein may be manufactured and used by or for the Government of the United States of America for governmental purposes without the payment of any royalties thereon or therefor.

BACKGROUND OF THE INVENTION

This invention relates to a system for identifying the proportional amount of the random noise component and the coherent signal component of an unspecified radio signal at a particular radio frequency. More particularly with the teachings of this invention, one is able to make nearly an instantaneous determination of whether a received unknown signal consists entirely of ramdom noise or a certain amount of coherency. Moreover, the invention provides a method of determining the relative percentage of the noise and coherent components signal.

A variety of instances point to the fact that it is desirable to know whether a received signal, which at first glance appears to be composed of entirely noise, contains a coherent component, however small. For example, when making measurements of cosmic ray showers at any given frequency, it is important, for meterological reasons, to know how much of the signal is atmospheric noise and how much of it is shower ionization. Shower ionization radio emission displays a phase relationship or coherency whereas atmospheric noise has no such established relationship. Another example is that a nuclear detonation from an extremely remote distance produces a weak radio emission hardly discernible from the ambient noise. The emission so produced may be examined at certain frequencies and has an established coherency. It is desirable to detect this detonation and by the use of this invention, the probability of making such a detection is increased because of the increased ability to detect the coherent component of the received signal. These two examples typify the need for a system capable of accurately and quickly determining the noise and coherent components of an unspecified signal.

SUMMARY OF THE INVENTION

This invention solves the problem of determining the relative amount of the noise component of a signal and the coherent component of that signal. This result is accomplished by the use of at least a pair of band pass filters each having the same center frequency but different bandwidths. The amplitude output of each filter is measured and a signal is ultimately provided to an oscilloscope or other device so that random noise may be viewed as being proportional to the square root of the ratio of the two amplitude outputs while the coherent component is proportional to the first power of such ratio. The method and apparatus disclosed herein is capable of being used with a computer or with mechanically variable filters.

OBJECTS OF THE INVENTION

It is an object of this invention to provide a simple circuit capable of distinguishing the ramdom noise component of an unspecified signal from the coherent component of the signal.

It is a further object of this invention to provide a circuit capable of distinguishing such components by the use of a pair of band pass filters.

Another object of this invention is to provide a method for selectively determining the proportional amount of noise and coherent components for a given frequency range.

Other objects, advantages and novel features of the invention will become apparent from the following detailed description of the invention when considered in conjunction with the accompanying drawings wherein:

FIG. 3 shows a plurality of wave forms depicting a display of the components of the unidentified signal.

DESCRIPTION OF THE INVENTION

Figure 1:
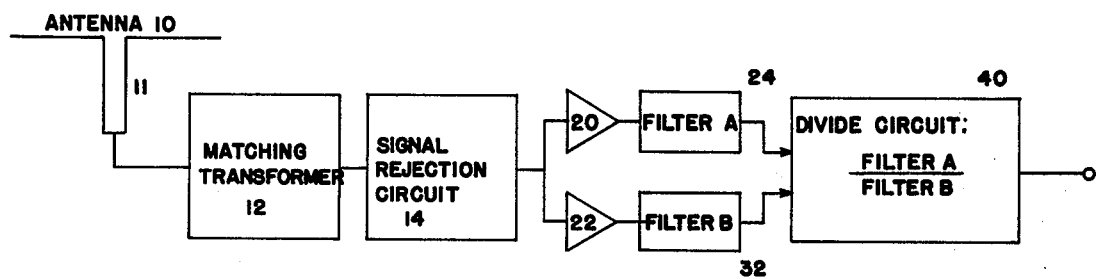
FIG. 1 is a block diagram of a structure used to practice this invention.

Referring to FIG. 1, a signal is detected by antenna 10. The antenna may be either of a non-directional type or a directional type. The former includes such antenna structure as a short dipole, folded dipole or monopole antenna; the use of the word "short" is taken to mean that the electrical length of the antenna is not much greater than half a wavelength. The latter antenna type includes such structure as phased arrays. The criterion for selecting the antenna is simply that it be capable of detecting a signal over the frequency range of interest. The signal from antenna 10 is provided to matching transformer 12 by line 11. The line 11 may be any type of conductor which performs in a manner consistant with a selection of antenna 10 and transformer 12. In some cases, conducting line 11 would be standard coaxial cable or wave guide.

The purpose of matching transformer 12 is for providing a suitable inpedance coupling between the antenna with its connecting line and the signal rejection circuit 14.

Signal rejection circuit 14 is typically a passive wideband filter for removing signals at unwanted frequencies. Also, the signal rejection circuit provides a preamplification and has means to balance the load of the circuit with the high impedance matching amplifier 20 and 22 for a particular frequency range.

The matching amplifier can be selected from various commercially available types. However, when selecting any particular amplifier, that amplifier should have a noise level below that which one expects to monitor. The bandwidth of the signal output of each amplifier must be wide when compared to that of the filters 24 and 32 as discussed below.

Figure 2:
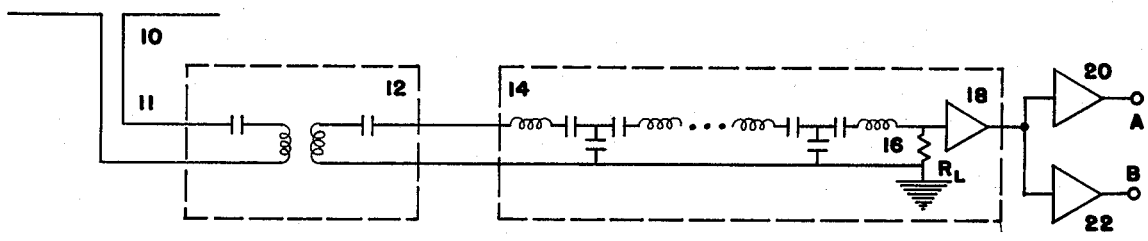
FIG. 2 is a schematic diagram of a typical filtering system.
Figure 2:
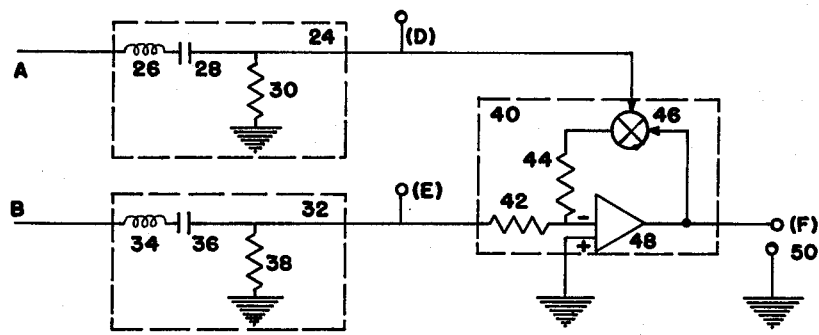

The matching amplifiers 20 and 22 provide identical signals to filters 24 and 32 respectively. Each filter is tuned to the same center frequency and the quality factor of the filter 24 is:

$$Q_A = \frac{W_o L_a}{R_a}$$

where $W_o$ is the center frequency for both filters, $L_a$ is the inductance of the coil 26 (FIG. 2), and $R_a$ is the resistance of resistor 30 (FIG. 2).

Similarly, the quality factor of filter 32 is:

$$Q_B = \frac{W_o L_b}{R_b}$$

where $W_o$ is the center frequency of both filters, $L_b$ is the inductance of coil 34, $R_b$ is the resistance of resistor 38.

The quality factor (hence bandwidth) of filter 24 must be different than the quality factor of filter 32 and in the example presented the bandwidth of filter 24 equals twice the bandwidth of filter 32.

For the purpose of explaining the operation of this circuit, let $f(t)$ be the output of matching transformer 12 and filter 24 when only a coherent component of the unspecified signal is present. Under this condition, the voltage of test point $d$ of filter 24 is:

$$V_d(t) = \frac{f(t)}{Q_A}.$$

Similarly, the voltage at test point $e$ of filter 32 is:

$$V_e(t) = \frac{f(t)}{Q_B}.$$

If the voltage of $V(t)$ is divided by divide circuit 40 and the output is taken as the quotient of $$\frac{V_e(t)}{V_d(t)},$$

the voltage shown at the output of the divide circuit when only the coherent component is present is:

$$V_f(t) = \frac{V_e(t)}{V_d(t)} = \frac{Q_A}{Q_B}.$$

However, a different result is obtained if $h(t)$ represents the output of transformer 12 and filter 24 when only a random noise component is present. Specifically:

$$V_d(t) = \frac{h(t)}{Q_A^{1/2}}.$$

For an understanding of the reason for this characteristic, reference is made to my article entitled "Thundercloud radio emission from cosmic-ray shower ionization electrons" published in Physical Review D, Volume 10, Number 1, dated July 1, 1974.

Similarly, the voltage of test point $e$ at filter 32 is:

$$V_e(t) = \frac{h(t)}{Q_B^{1/2}}.$$

If the voltage at point $e$ is divided by the voltage of $d$ by circuit 40 the output at point $f$ when only random noise is present is:

$$V_f(t) = \frac{V_e(t)}{V_d(t)} = \left(\frac{Q_A}{Q_B}\right)^{1/2}.$$

Therefore, it can be seen that the voltage provided at point f is dependent upon the type of signal received and processed by the two filters. For example, when the device receives an unspecified signal which is composed entirely of a noise component, the voltage is at one level. Whereas when the signal is composed of an entirely coherent component, the voltage at point $f$ is at another level. When an unspecified signal consists of an average of 50% noise component and 50% coherent component, the average voltage at point f will be:

$$.5\left(\frac{Q_B}{Q_A}\right) + .5\left(\frac{Q_B}{Q_A}\right)^{1/2}$$

It should be obvious from the above explanation that the signal from each filter may be recorded by any well known recording technique and processed at a later time for the determination of the amount of each component existing in the signal. Also, by the use of a computer program that is able to establish the appropriate filter characteristics, the recorded data may be processed over a frequency range by selectively varying (mathematically or mechanically) the center frequency of the filters.

For a more detailed explanation of the structure, reference is made to FIG. 2. Matching transformer 12 is designed by the use of well known network equations. The transformer may be either a "T" network or a "$\pi$" network.

The signal rejection circuit 14 may be a simple T network but a $\pi$ network can also be used and any of the end stages can be "M" derived. The filter indicated in the drawing has three stages; however, fewer or greater stages can be used. Both matching transformer and the wideband filter should be made from passive components in order to minimize circuit noise. For a reference on how to best select this type of filter refer to The Analysis, Design, and Synthesis of Electrical Filters, Humpherys, DeVeryl S., Prentice-Hall, Incorporation Englewood Cliffs, N. J., 1970.

Load resistor 16 is selected at a value to properly match the impedance of the rejection circuit 14 to that of the pair of matching amplifiers 20 and 22.

Matching amplifiers 20 and 22 are low noise operational amplifiers or may be of the low noise IF type. Such amplifiers may be purchased from Motorola or RCA.

Filters 24 and 32 are designed as follows:

$$Q_i = \frac{W_o L_i}{R_i}; \quad W_o = \frac{1}{\sqrt{L_i C_i}}$$

where $i = A, B$.

Divide circuit 40 consists of op amp 48, multiplier 46, and balanced resistor 42. The op amp 48 has a very high input impedance in relationship to the rest of the circuit. As a result it draws a negligible amount of current. For the purposes of explanation, the current thru resistors 42 and 44 is identical, since the sum of the current entering the point equals the sum of the current leaving the point $$\frac{V_e - V_{in}}{R_{42}} + \frac{V_d V_f - V_{in}}{R_{44}} = 0$$

Where $V_{in}$ is the voltage taken between resistors 42 and 44 and ground. But $$V_{in} = V_f A;$$

where $A$ is the large gain (on the order to $10^5$) of operational amplifier 48 so $$\frac{V_e - V_f A}{R_{42}} + \frac{V_d V_f - V_f A}{R_{44}} = 0$$

or $$v_f = R_{44}V_e/(R_{42}V_d - R_{42}/A - R_{44}/A)$$

Since the operational amplifier has an extremely large gain $$V_f \approx -\frac{R_{44}V_e}{R_{42}V_d}.$$

In all the figures, the assumption is made that filters A and B have the same center frequency and that the bandpass of filter A is twice that of filter B.

FIG. 3(a) depicts the reception of a coherent signal. The solid line represents the output from filter A, the dashed line represents the output from filter B. It should be noted the output of filter A is twice that of filter B.

FIG. 3(b) depicts the reception of an incoherent signal. The solid line represents the output of filter A, the dashed line represents the output from filter B. It should be noted that the voltage on the output of filter A is the $\sqrt{2}$ times the output of filter B.

FIG. 3(c) depicts the sum of the coherent and incoherent signals of FIGS. 3(a) and 3(b) respectively. The solid line represents the voltage on the output of filter A whereas the dashed line indicates the output of filter B.

Finally, FIG. 3(d) depicts the output of the divide circuit 40. for the three previously illustrated cases. The output of filter A is divided by the output of filter B to provide the solid line of FIG. 3(d). FIG. 3(d) also depicts the average value for a coherent signal as well as the average value for an incoherent signal. It should be noted that the output of divide circuit 40 provides the proportional amount of coherent and incoherent components of an unspecified signal at any given time.

Obviously many modifications and variations of the present invention are possible in the light of the above teachings. It is therefore to be understood that within the scope of the appended claims the invention may be practiced otherwise than as specifically described.

I claim:

1. A method of determining the existence of a coherent component of an unspecified signal comprising:
   a. receiving an unspecified signal;
   b. rejecting any unwanted frequency of the unspecified signal to provide a retained signal and a rejected signal;
   c. splitting the retained signal into a first and second part;
   d. passing said first part thru a first filter having a selected center frequency and an established quality factor to provide a first filter output signal;
   e. passing said second part thru a second filter having a center frequency identical to said first filter and an established quality factor different from said first filter to provide a second filter output signal;
   f. dividing said first filter output signal by said second filter output signal to provide a final signal indicative of the magnitude of the coherent component of the unspecified signal at the selected center frequency.

2. The method of determining the existence of the coherent component of the unspecified signal of claim 1 wherein the quality factor of the first filter is equal to two times the quality factor of the second filter.

3. The method of determining the existence of the coherent component of the unspecified signal of claim 1 further comprising:
   changing the center frequency of the first and second filters so that said final signal indicates the magnitude of the coherent component at the changed frequency.

4. The method of determining the existence of the coherent component of the unspecified signal of claim 1 further comprising:
   displaying said final signal.

* * * * *